(12) United States Patent
Kang et al.

(10) Patent No.: US 11,892,500 B2
(45) Date of Patent: Feb. 6, 2024

(54) ELEVATOR UNIT FOR TRANSFERRING TRAY AND TEST HANDLER INCLUDING SAME

(71) Applicant: SEMES CO., LTD., Cheonan-si (KR)

(72) Inventors: Jin Ho Kang, Cheonan-si (KR); Joo Hyun Seo, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 0 days.

(21) Appl. No.: 17/857,978

(22) Filed: Jul. 5, 2022

(65) Prior Publication Data

US 2023/0010924 A1  Jan. 12, 2023

(30) Foreign Application Priority Data

Jul. 7, 2021 (KR) .................. 10-2021-0089032

(51) Int. Cl.
*G01P 3/48* (2006.01)
*G01R 31/28* (2006.01)
*H01L 21/677* (2006.01)
*B66B 9/00* (2006.01)

(52) U.S. Cl.
CPC ............ *G01R 31/2867* (2013.01); *B66B 9/00* (2013.01); *G01R 31/2862* (2013.01); *H01L 21/677* (2013.01)

(58) Field of Classification Search
CPC ............ G01R 31/2893; G01R 31/2867; G01R 31/2862; G01R 31/2874; H01L 21/67742; H01L 21/68792; H01L 21/67178; H01L 21/67303; H01L 21/66712; H01L 21/67248; H01L 21/67766; H01L 21/68
See application file for complete search history.

(56) References Cited

U.S. PATENT DOCUMENTS

| | | | |
|---|---|---|---|
| 2002/0034436 A1* | 3/2002 | Peterson | H01L 21/67386 414/795.3 |
| 2008/0298946 A1* | 12/2008 | Shim | G01R 31/2886 414/749.1 |
| 2014/0262979 A1* | 9/2014 | Bonora | H01L 21/67271 209/577 |

FOREIGN PATENT DOCUMENTS

KR   100928633   6/2009

* cited by examiner

*Primary Examiner* — Thang X Le

(57) ABSTRACT

An elevator unit for transferring a tray includes a tray guide block on which a tray is seated, a wrapping connector driving member configured to elevate and lower the tray guide block, a fixed fastener connected to the tray guide block, and a corrective fastener connected to the wrapping connector driving member and configured to rotatably coupled to the fixed fastening member.

20 Claims, 12 Drawing Sheets

ELEVATOR UNIT FOR TRANSFERRING TRAY AND TEST HANDLER INCLUDING SAME

CROSS REFERENCE TO RELATED APPLICATION

The present application claims priority to Korean Patent Application No. 10-2021-0089032, filed Jul. 7, 2021 the entire contents of which is incorporated by reference herein for all purposes.

BACKGROUND OF THE INVENTION

Field of the Invention

The present disclosure relates to an elevator unit for transferring a tray and a test handler including same. More particularly, the present disclosure relates to a means of correcting a direction of force applied to a tray guide block according to a movement of a wrapping connector driving member through a corrective fastening member connecting the tray guide block having a tray seated thereon and configured to be transferred, and the wrapping connector driving member, which is configured to elevate and lower the tray guide block, whereby eccentricity and an eccentric load are removed.

Description of the Related Art

In general, semiconductor devices may be provided on a silicon wafer used as a semiconductor substrate by repeatedly performing a series of manufacturing processes, and the semiconductor devices provided as described above may be manufactured into semiconductor packages through a dicing process, a bonding process, and a packaging process.

The manufactured semiconductor packages may be determined as good or defective through an electrical performance test.

The test process may be performed using a test handler that is configured to handle the semiconductor packages and a tester that is configured to provide a test signal to inspect the semiconductor packages.

After accommodating the semiconductor packages in insert assemblies mounted on a test tray and then electrically connecting terminals for external connection of the semiconductor packages stored in the insert assembly to the tester, the test process may be performed. An interface board for connecting the semiconductor packages and the tester may be mounted on a sidewall of a test chamber for performing the test process, and socket boards for connection with the semiconductor packages may be disposed on the interface board. In addition, the interface board may be connected to the tester that is to provide the test signal to the semiconductor packages.

In order to perform such a test process, the tray on which the semiconductor packages are mounted is transferred through an elevator unit, and the elevator unit may be elevated and lowered using a wrapping connector driving means such as a chain member, a belt member, or the like. At this time, due to eccentricity and an eccentric load caused by a movement of the chain member or the belt member due to a structure of the elevator unit, a driving part may be jammed, and furthermore, stress caused by the continuous accumulation of the eccentricity and the eccentric load causes wear and damage to ball bushes and the like that support a stable movement of the tray.

The foregoing is intended merely to aid in the understanding of the background of the present disclosure, and is not intended to mean that the present disclosure falls within the purview of the related art that is already known to those skilled in the art.

DOCUMENTS OF RELATED ART

Patent Document (Patent Document 0001) Korean Patent No. 10-0928633

SUMMARY OF THE INVENTION

Accordingly, the present disclosure has been made keeping in mind the above problems occurring in the related art, and the present disclosure is intended to resolve problems caused by eccentricity and an eccentric load when a wrapping connector driving means such as a chain, a belt, or the like is applied to an elevator unit configured to transfer a tray.

In particular, the present disclosure is intended to solve the problem that transferring of the tray is not smoothly performed because of jamming of a driving part due to the eccentricity and the eccentric load generated during a movement of the wrapping connector driving member.

Furthermore, the present disclosure is intended to solve the problem of wear and breakage of ball bushes that support the movement of the tray due to the stress caused by the continuous accumulation of the eccentricity and the eccentric load.

The objective of the present disclosure is not limited to the above, and other objectives and advantages of the present disclosure not mentioned may be understood by the following description.

In order to achieve the above objective, according to an embodiment of the present disclosure, an elevator unit for transferring a tray includes a tray guide block on which a tray is seated, a wrapping connector driving member configured to elevate and lower the tray guide block, a fixed fastener connected to the tray guide block, and a corrective fastener connected to the wrapping connector driving member and configured to rotatably coupled to the fixed fastening member.

According to an embodiment of the present disclosure, a test handler includes: a soak chamber configured to control semiconductor devices seated on a tray to a test temperature; a test chamber configured to perform electrical tests on the semiconductor devices seated on the tray; a desoak chamber configured to control the semiconductor devices seated on the tray to a room temperature; and an elevator unit for transferring a tray.

According to an embodiment of the present disclosure, an elevator unit for transferring a tray includes: a first tray guide block on which the tray is seated; a second tray guide block on which the tray is seated and which is positioned above the first tray guide block in a height direction; a first wrapping connector driving member connected to a side surface of the first tray guide block to elevate and lower the first tray guide block; a second wrapping connector driving member spaced apart from the first wrapping connector driving member in a horizontal direction and connected to a side surface of the second tray guide block to elevate and lower the second tray guide block; a fixed fastening member mounted to each of the first tray guide block and the second tray guide block; and a compensation fastening member mounted on each of the first wrapping connector driving member and the second wrapping connector driving member, connected to the fixed fastening member corresponding thereto, and rotating around the fixed fastening member corresponding thereto as a center so that a direction of force applied to each of the first tray guide block and the second tray guide block according to the movement direction of each of the first wrapping connector driving member and the second wrapping connector driving member is corrected.

As described above, according to the present disclosure, it is possible to resolve eccentricity and an eccentric load generated during elevating or lowering of the tray guide block, which has the tray seated thereon and is configured to be transferred in an elevator unit of a wrapping connector driving means.

In particular, by correcting a direction of force applied to a tray guide block during elevating or lowering of the tray guide block through a corrective fastening member, it is possible to solve the problem that transferring of the tray is not smoothly performed because of jamming of a driving part due to the eccentricity and the eccentric load, and it is possible to solve the problem that wear and breakage of the ball bushes that support the movement of the tray occur due to the stress caused by the continuous accumulation of eccentricity and eccentric loads.

Effects of the present disclosure are not limited to those mentioned above, and other effects not mentioned will be clearly understood by those of ordinary skill in the art from the description below.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Hereinafter, exemplary embodiments of the present disclosure will be described in detail with reference to the accompanying drawings, but the present disclosure is not limited to or restricted by the embodiments.

In order to explain the present disclosure, the operational advantages of the present disclosure, and the objectives achieved by the practice of the present disclosure, the exemplary embodiments of the present disclosure are exemplified below and will be described with reference thereto.

First, terms used in the present application are only used to describe specific embodiments and are not intended to limit the present disclosure, and the singular expression may include a plural expression unless the context clearly indicates otherwise.

In addition, in this application, terms such as "comprise" or "have" are intended to designate that a feature, a number, a step, an operation, a component, a part, or a combination thereof described in the specification exists, but it should be understood that this does not preclude the possibility of addition or presence of one or more other features, numbers, steps, operations, components, parts, or combinations thereof.

In describing the present disclosure, when it is determined that a detailed description of a related known configuration or function may obfuscate the gist of the present disclosure, the detailed description thereof will be omitted.

The present disclosure proposes an elevator unit for transferring a tray and a test handler applying the elevator unit for transferring a tray, which remove eccentricity and an eccentric load by correcting a direction of force applied to a tray guide block.

Figure 1:
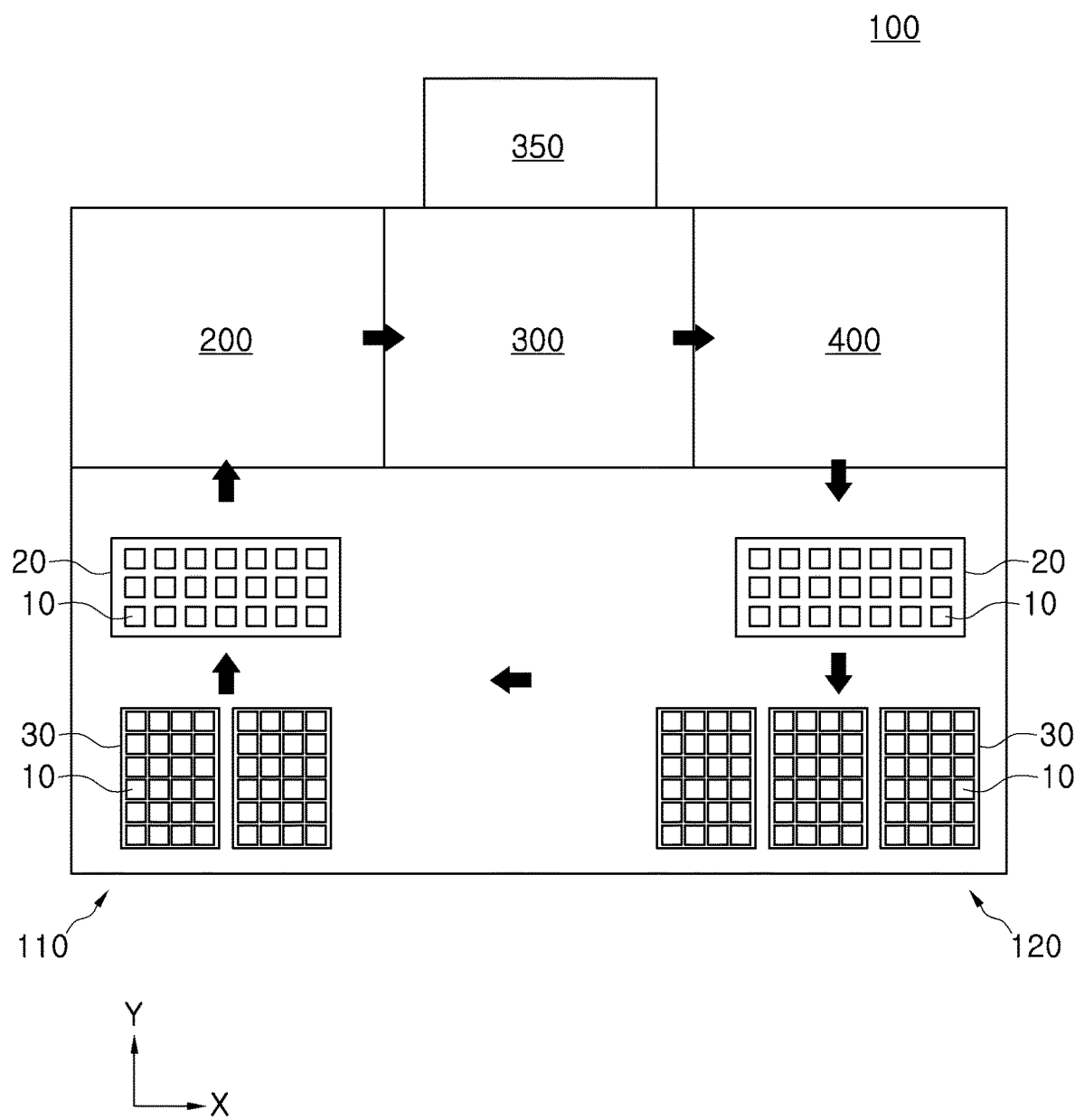
FIG. 1 is a view showing a schematic configuration diagram of an embodiment of a test handler according to the present disclosure.

FIG. 1 is a view showing a schematic configuration diagram of an embodiment of a test handler according to the present disclosure.

A test handler 100 may be used for electrical testing of the semiconductor devices 10.

A chamber module includes a soak chamber 200, a test chamber 300, and a desoak chamber 400 and may perform electrical tests on the semiconductor devices 10. A loader module 110 may store the semiconductor devices 10 in a test tray 20 and load the test tray 20 into the chamber module. An unloader module 120 may unload the test tray 20 from the chamber module after the test process for the semiconductor devices 10 is completed and classify the semiconductor devices 10 according to the test results of the semiconductor devices 10.

The test tray 20 may include insert assemblies (not shown) for storing the semiconductor devices 10. The loader module 110 may transfer the semiconductor devices 10 from a customer tray 30 to the test tray 20, and then transfer the test tray 20 to the chamber module. After the test process is completed, the unloader module 120 may classify the semiconductor devices 10 according to the test results, transfer the semiconductor devices to the customer trays 30, and transfer the test tray 20 to the loader module 110.

The loader module 110 may include a first device transfer unit (not shown) for transferring the semiconductor devices 10 from the customer tray 30 to the test tray 20, and the unloader module 120 may include a second device transfer unit (not shown) for transferring the semiconductor devices 10 from the test tray 20 to the customer trays 30.

The chamber module may include: a test chamber 300 providing a test space for electrical testing of the semiconductor devices 10; a soak chamber 200 connected to one side of the test chamber 300 and configured to control a temperature of the semiconductor devices 10 to a preset test temperature; and the desoak chamber 400 connected to an opposite side of the test chamber 300 and configured to restore the temperature of the semiconductor devices 10 to room temperature after the test process is completed.

The test tray 20 may be loaded into the soak chamber 200, and preheating or precooling of the semiconductor devices 10 may be performed in the soak chamber 200. Subsequently, the test tray 20 may be transferred to the test chamber 300 and, after a test process is performed in the test chamber 300, may be transferred to the desoak chamber 400. The temperature of the semiconductor devices 10 may be restored to a room temperature in the desoak chamber 400, and subsequently, the test tray 20 may be unloaded from the desoak chamber 400.

The loader module 110 may include a first rotation unit (not shown) for rotating the test tray 20 in a vertical direction, and the test tray 20 may be transferred to the soak chamber 200 in a state of being erected in the vertical direction. The test tray 20 may be moved in a horizontal direction, for example, a Y-axis direction in the soak chamber 200, and the temperature of the semiconductor devices 10 stored in the test tray 20 may be controlled during the movement. Subsequently, the test tray 20 may be transferred in a horizontal direction, for example, in an X-axis direction, to the test chamber 300 and, after the test process is completed in the test chamber 300, may be transferred in the X-axis to the desoak chamber 400. In the desoak chamber 400, the test tray 20 may move in a direction opposite to the movement direction in the soak chamber 200, that is, in a negative Y-axis direction, and the temperature of the semiconductor devices 10 may be recovered to the room temperature during the movement. The unloader module 120 may include a second rotation unit (not shown) for rotating the test tray 20 unloaded from the desoak chamber 400 again in the horizontal direction.

Figure 2:
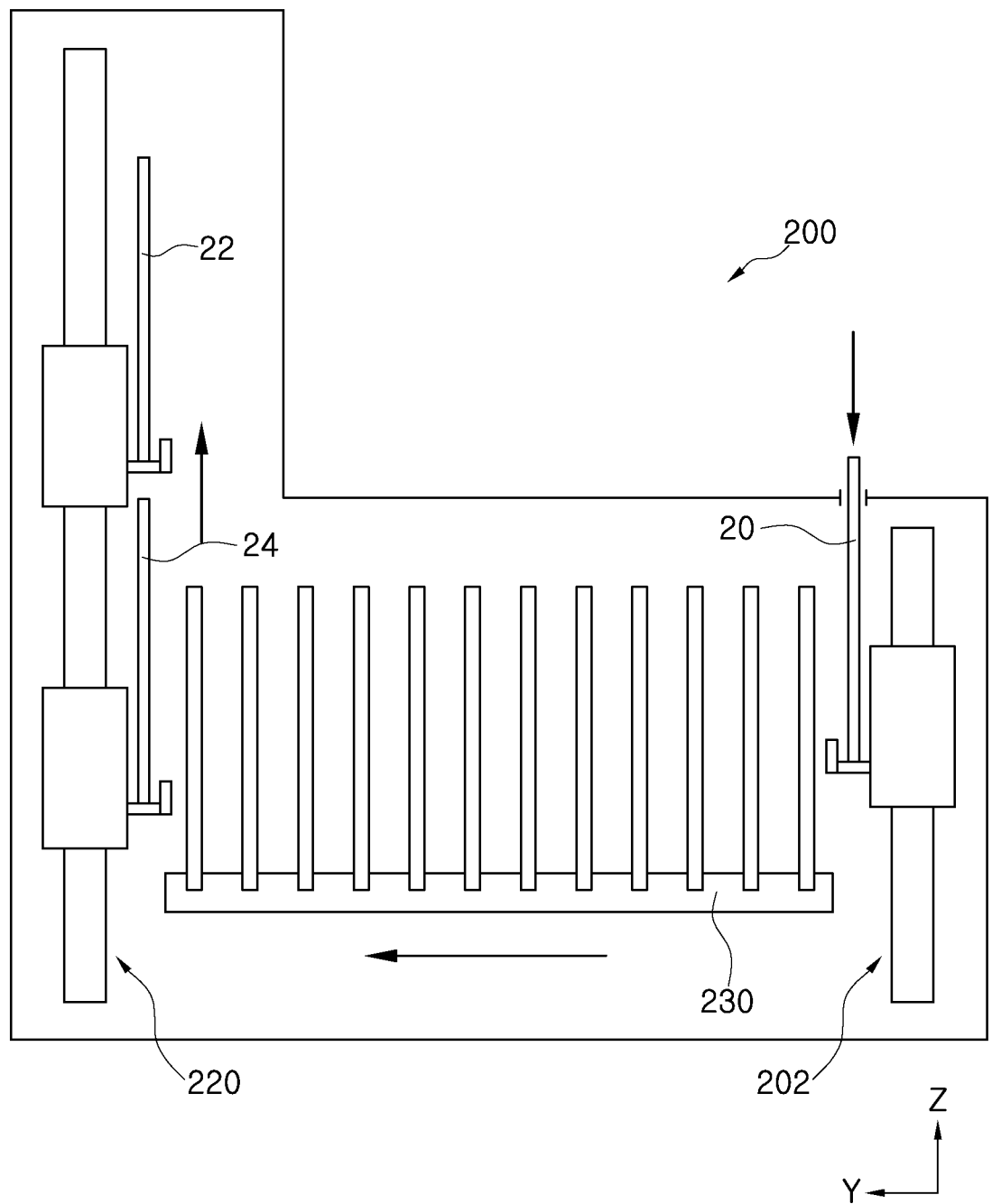
FIG. 2 is a view showing an embodiment of a soak chamber in the present disclosure.

FIG. 2 shows an embodiment for explaining the soak chamber shown in FIG. 1.

The soak chamber 200 may provide a temperature control space for controlling the temperature of the semiconductor devices 10, and a first elevator unit 202 for transferring the test tray 20 to the inside of the soak chamber 200 may be disposed at one side of an inner side of the soak chamber 200. In addition, a second elevator unit 220 for transferring the test tray 20 to the test chamber 300 may be disposed on an opposite side of the inner side of the soak chamber 200, and in addition, a first tray transfer unit 230 for moving the test tray 20 from the first elevator unit 202 toward the second elevator unit 220 in the Y-axis direction may be disposed in the soak chamber 200.

Figure 3:
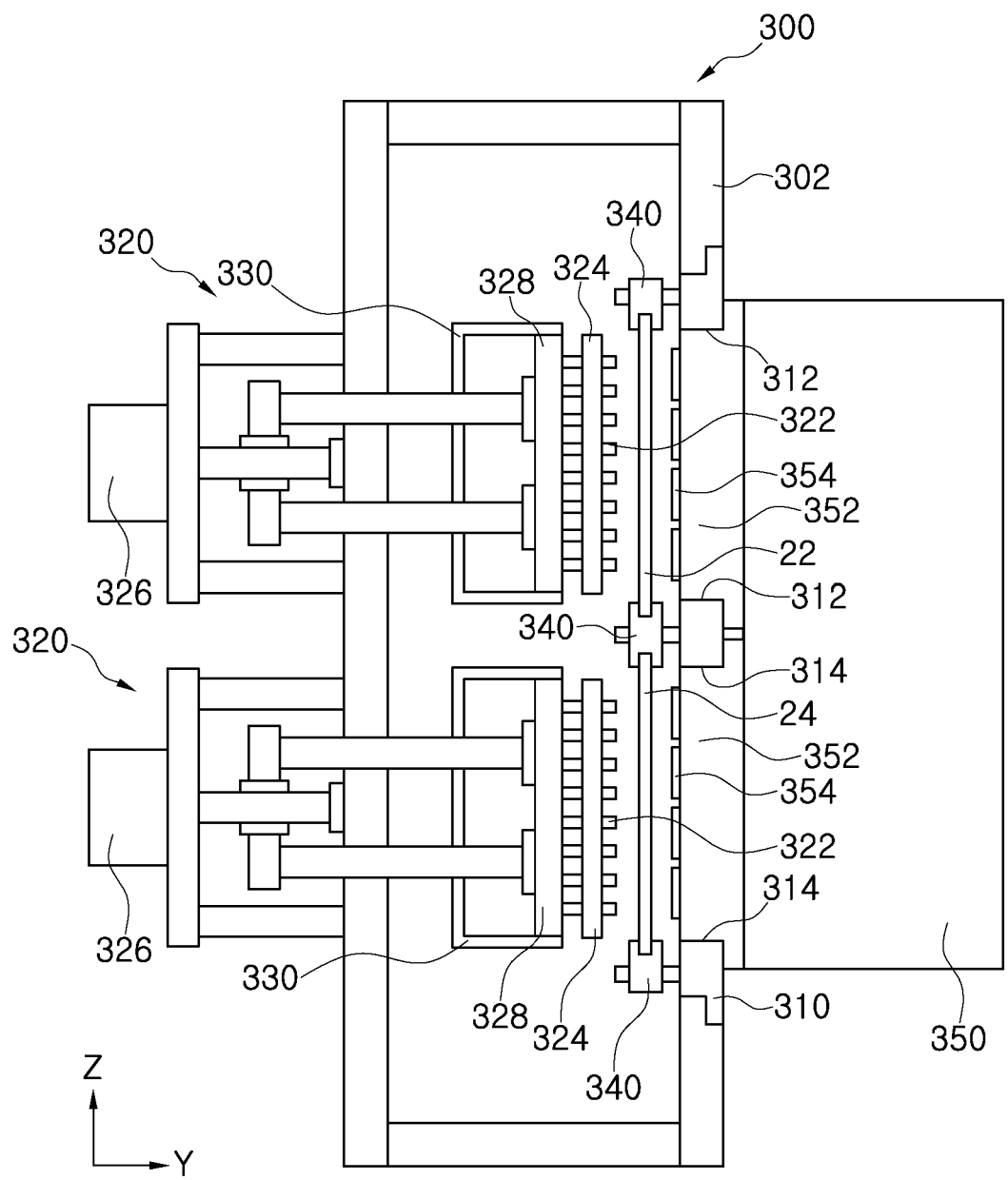
FIG. 3 is a view showing an embodiment of a test chamber in the present disclosure.

FIG. 3 is a view showing an embodiment for explaining a test chamber in the present disclosure.

The test chamber 300 may provide a test space for electrical testing of the semiconductor devices 10. As an example, as shown in FIG. 3, two sheets of test trays 22 and 24 may be supplied with top and bottom into the test chamber 300. On the sidewall 302 of the test chamber 300, a tester 350 configured to provide test signals for electrical testing of the semiconductor devices 10 may be docked outside a sidewall 302 of the test chamber 300, and on the sidewall 302 of the test chamber 300, a plate 310 for a device under test (DUT) having an upper opening part 312 for connecting the semiconductor devices 10 stored in the upper test tray 22 to the tester 350 and a lower opening part 314 for connecting the semiconductor devices 10 stored in the lower test tray 24 to the tester 350 may be mounted.

Interface boards 352 for electrically connecting the semiconductor devices 10 and the tester 350 may be disposed in the upper opening part 312 and the lower opening part 314, respectively, and socket boards 354 for connection with the semiconductor devices 10 may be mounted on the interface boards 352.

The test chamber 300 may include a pushing unit 320 for bringing the semiconductor devices 10 into close contact with the socket boards 354. The pushing unit 320 may include: match plates 324 equipped with pushers 322 for bringing the semiconductor devices 10 into close contact with the socket boards 354; driving units 326 for providing pressing force to the match plates 324; and pressure plates 328 for transferring the pressing force to the match plates 324. In addition, ducts 330 provided with a temperature control gas for controlling the temperature of the pushers 322, for example, heated air or a cooling gas, may be coupled to the rear of the pressure plate 328, respectively.

Although not shown, the test handler 100 may include a second tray transfer unit (not shown) for transferring the upper test tray 22 and the lower test tray 24 from the soak chamber 200 into the test chamber 300. Guide rails 340 for guiding the upper test tray 22 and the lower test tray 24 may be mounted on an inner surface of the plate 310 for the DUT, and the second tray transfer unit may move the upper test tray 22 and the lower test tray 24 from the second elevator unit 220 along the guide rails 340 into the test chamber 300.

Figure 4:
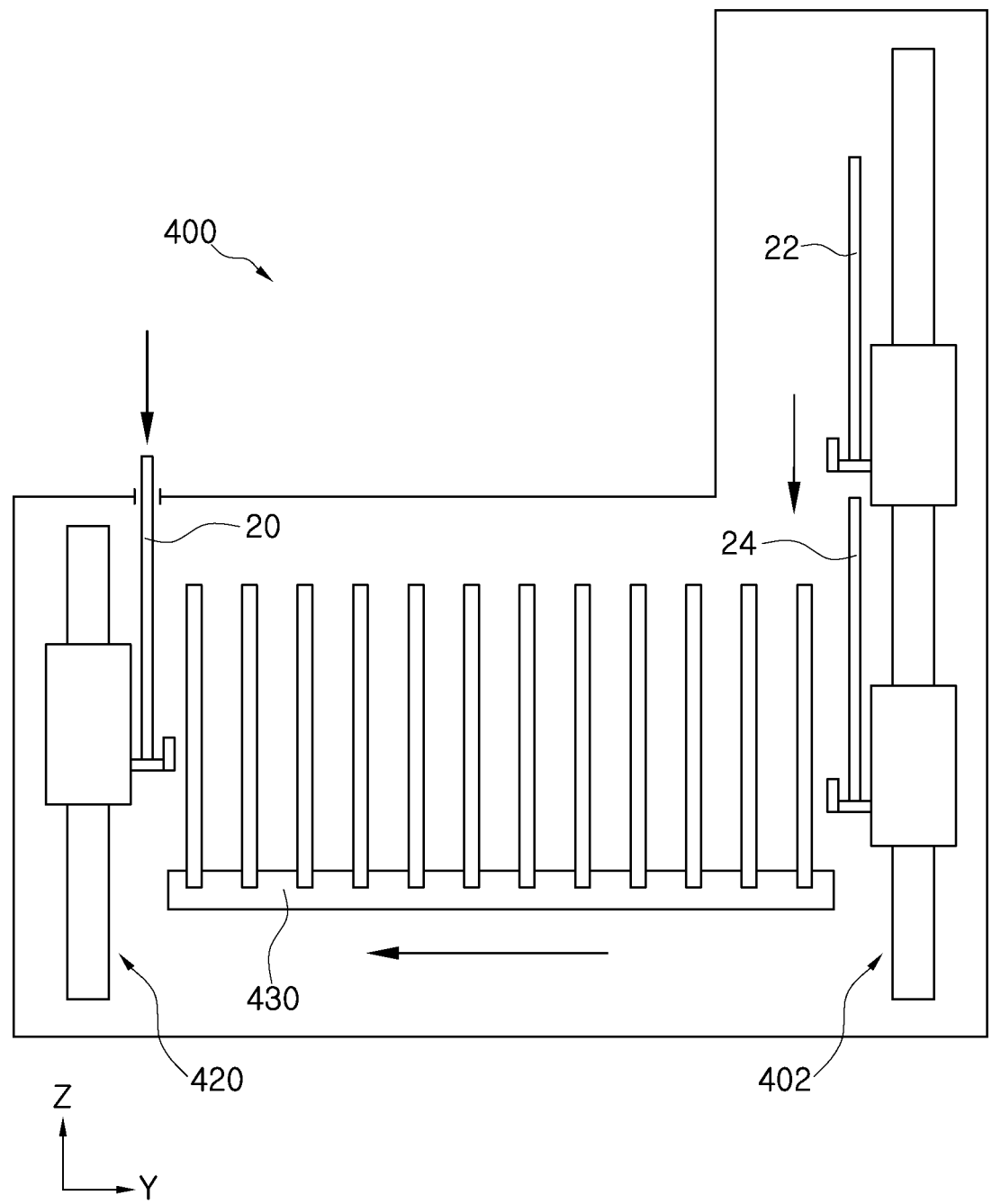
FIG. 4 is a view showing an embodiment of a desoak chamber in the present disclosure.

FIG. 4 shows an embodiment for explaining the desoak chamber 400 shown in FIG. 1.

The desoak chamber 400 may be used to restore the temperature of the semiconductor devices 10 to the room temperature. A third elevator unit 402 may be disposed on one side of the inside of the desoak chamber 400, and a fourth elevator unit 420 may be disposed on an opposite side of the inside of the desoak chamber 400. In addition, although not shown, the test handler 100 may include a third tray transfer unit (not shown) for moving the upper test tray 22 and the lower test tray 24 from the test chamber 300 into the desoak chamber 400, and the desoak chamber 400 may include a fourth tray transfer unit 430 for moving the upper test tray 22 and the lower test tray 24 from the third elevator unit 402 to the fourth elevator unit 420.

The present disclosure proposes the elevator unit applied to the chamber module described above. Hereinafter, the elevator unit for transferring a tray according to the present disclosure will be described through embodiments.

Figure 5:
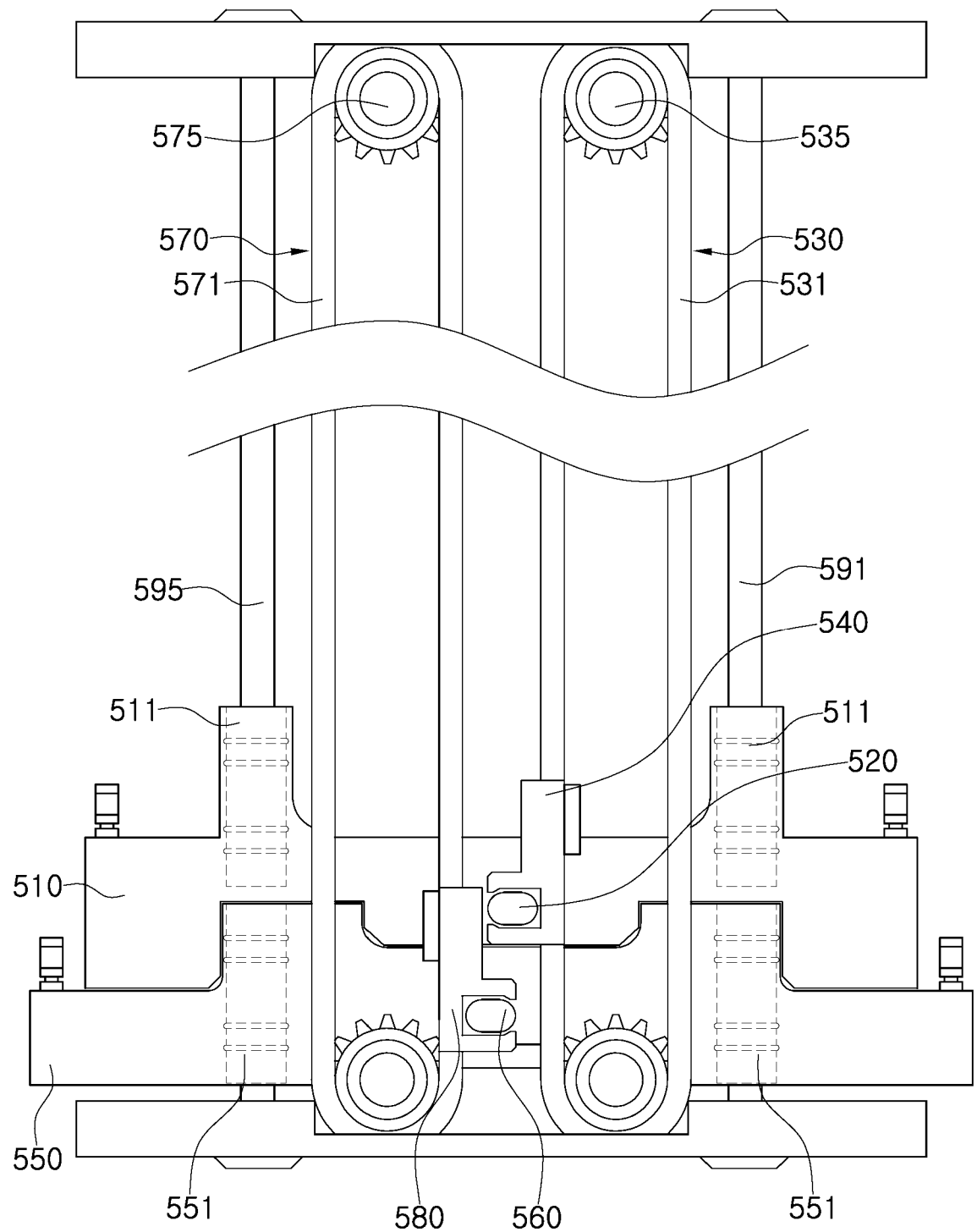
FIG. 5 is a view showing an embodiment of an elevator unit for transferring a tray according to the present disclosure.

FIG. 5 is a view showing an embodiment of an elevator unit for transferring a tray according to the present disclosure.

An elevator unit 500 may include: tray guide blocks 510 and 550 on each of which the tray is seated; a wrapping connector driving member 530 and 570 configured to elevate and lower the tray guide blocks 510 and 550, respectively; elevating and lowering driving units (not shown) configured to drive the wrapping connector driving member 530 and 570; and the like, respectively.

The tray guide blocks 510 and 550 may be provided with a plurality of multi-stages in a height direction in which the tray guide blocks 510 and 550 are ascending, and, as an example, may include a first tray guide block 550 and a second tray guide block 510 positioned above the first tray guide block 550.

The wrapping connector driving members 530 and 570 may each include chain members or belt members 531 and 571 and the like that have opposite ends connected to each other, thereby being able to rotate indefinitely.

Each of the chain members or belt members 531 and 571 is fastened to a corresponding one of the pulleys 535 and 575, and each of elevating and lowering driving units (not shown) may rotate a corresponding one of the pulleys 535 and 575, thereby enabling the chain members or belt members 531 and 571 to be rotated.

When a plurality of tray guide blocks may be disposed, a wrapping connector driving member may be disposed to correspond to each of the tray guide blocks, and as an example, in order to elevate and lower the first tray guide block 550, a first wrapping connector driving member 570 may be disposed, and in order to elevate and lower the second tray guide block 510, a second wrapping connector driving member 530 may be disposed.

The first wrapping connector driving member 570 and the second wrapping connector driving member 530 may be disposed to be spaced apart from each other so as not to affect a mutual operation due to an arrangement structure. That is, the first wrapping connector driving member 570 may be disposed to be spaced apart to the right from the center of the first tray guide block 550, and the second wrapping connector driving member 530 may be disposed to be spaced apart to the left from the center of the second tray guide block 510.

Fixed fastening members (i.e., fixed fastener) 520 and 560 are mounted to protrude on side surfaces of the tray guide blocks 510 and 550, respectively, corrective fastening members 540 and 580 (i.e., corrective fasteners) are attached to the wrapping connector driving members 530 and 570, respectively, and the fixed fastening members 520 and 560 may be connected to the corrective fastening members 540 and 580, respectively.

Figure 6A:
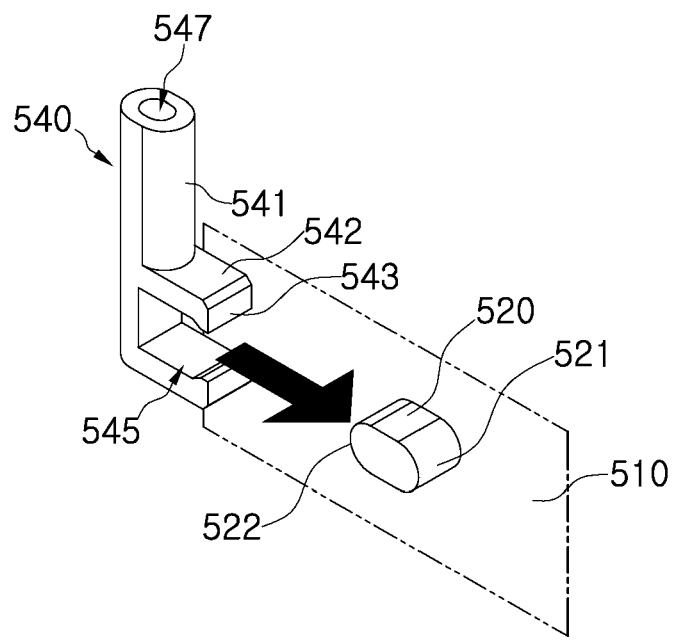
FIGS. 6A and 6B are views each showing a connection relationship between a fixed fastening member and a corrective fastening member in an embodiment.
Figure 6B:
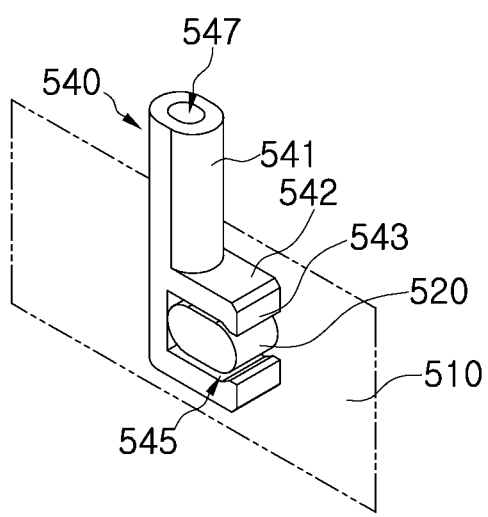

A connection structure of the fixed fastening members 520 and 560 and the corrective fastening members 540 and 580 will be described with reference to FIGS. 6A and 6B. FIGS. 6A and 6B show the connection structure of the corrective fastening member 540 mounted on the second wrapping connector driving member 530 and the fixed fastening member 520 mounted on the second tray guide block 510.

In order not to interfere with a movement of the wrapping connector driving member 530, the fixed fastening member 520 may be mounted to protrude at a portion adjacent to a side surface of the wrapping connector driving member 530 on the side surface of the tray guide block 510.

In addition, the corrective fastening member 540 may include a fixed fastening part 541 having a through hole 547 in which the wrapping connector driving 530 is fixedly mounted and a rotative fastening part 542 extending laterally from the fixed fastening part 541 and connected to the fixed fastening member 520.

The rotative fastening part 542 of the corrective fastening member 540 may have an opening part provided on one side thereof to provide an insertion space 545 into which the fixed fastening member 520 is inserted. Here, the insertion space 545 may be provided as a space having a sectional area larger than that of the fixed fastening member 520.

The fixed fastening member 520 has a rectangular cross section and may have curved portions 521 and 522 provided at opposite ends thereof, thereby aiding the rotation of the corrective fastening member 540. In the case of FIG. 6, the cross section of the fixed fastening member 520 is shown in an elliptical shape to more clearly express the curved portions 521 and 522, but this may be appropriately adjusted as needed. Accordingly, the fixed fastening member 520 may be changed to have various polygonal cross sections.

Furthermore, the rotative fastening part 542 may be provided with a locking protrusion 543 protruding toward the opening part to prevent separation of the fixed fastening member 520.

As described above, the fixed fastening members 520 and 560 are connected to the corrective fastening members 540 and 580, respectively, so that upward or downward force according to the movement of the wrapping connector driving members 530 and 570 may be transferred to the tray guide blocks 510 and 550, respectively, through the corrective fastening members 540 and 580 and the fixed fastening members 520 and 560, respectively.

In particular, in the present disclosure the first wrapping connector driving member 570 and the second wrapping connector driving member 530 are disposed away from the central portion of the first tray guide block 550 and the second tray guide block 510, respectively, whereby it is proposed a structure that may resolve the eccentricity and the eccentric load generated during the elevating and lowering movement.

To this end, the corrective fastening members 540 and 580 are connected to be floating to (i.e., are rotatably connected to) the fixed fastening members 520 and 560, respectively, so that the corrective fastening members 540 and 580 may be rotated around the fixed fastening members 520 and 560 as centers, respectively, according to directions of the force applied thereto, whereby correcting the directions of the force to resolve the eccentricity and the eccentric load.

An operation of resolving the eccentricity and the eccentric load by correcting the direction of force through the corrective fastening members 540 and 580 and the fixed fastening members 520 and 560 will be described in detail through embodiments related to an operation relationship of the elevating unit for transferring a tray according to the present disclosure.

The tray guide blocks 510 and 550 may be supported by guide members 591 and 595, respectively, disposed in directions of elevating and lowering, thereby being able to be stably elevated and lowered. For an efficient guide of the guide members 591 and 595, ball bushes 511 and 551, which the guide members 591 and 595 are passed through and connected to, may be mounted in the tray guide blocks 510 and 550, respectively, thereby each supporting the elevating and lowering of corresponding one of the tray guide blocks 510 and 550.

The ball bushes 511 may be mounted on opposite sides of the tray guide block 510, and the ball bushes 551 may be mounted on opposite sides of the tray guide block 550. In this case, the ball bushes 511 and 551 may be elevated and lowered while being supported by the guide members 591 and 595 disposed on opposite sides, respectively, of each of the tray guide blocks 510 and 550 at the same time.

FIG. 5 shows one side surface of an embodiment, and the same configuration may be disposed on even an opposite side surface of the embodiment.

Figure 7:
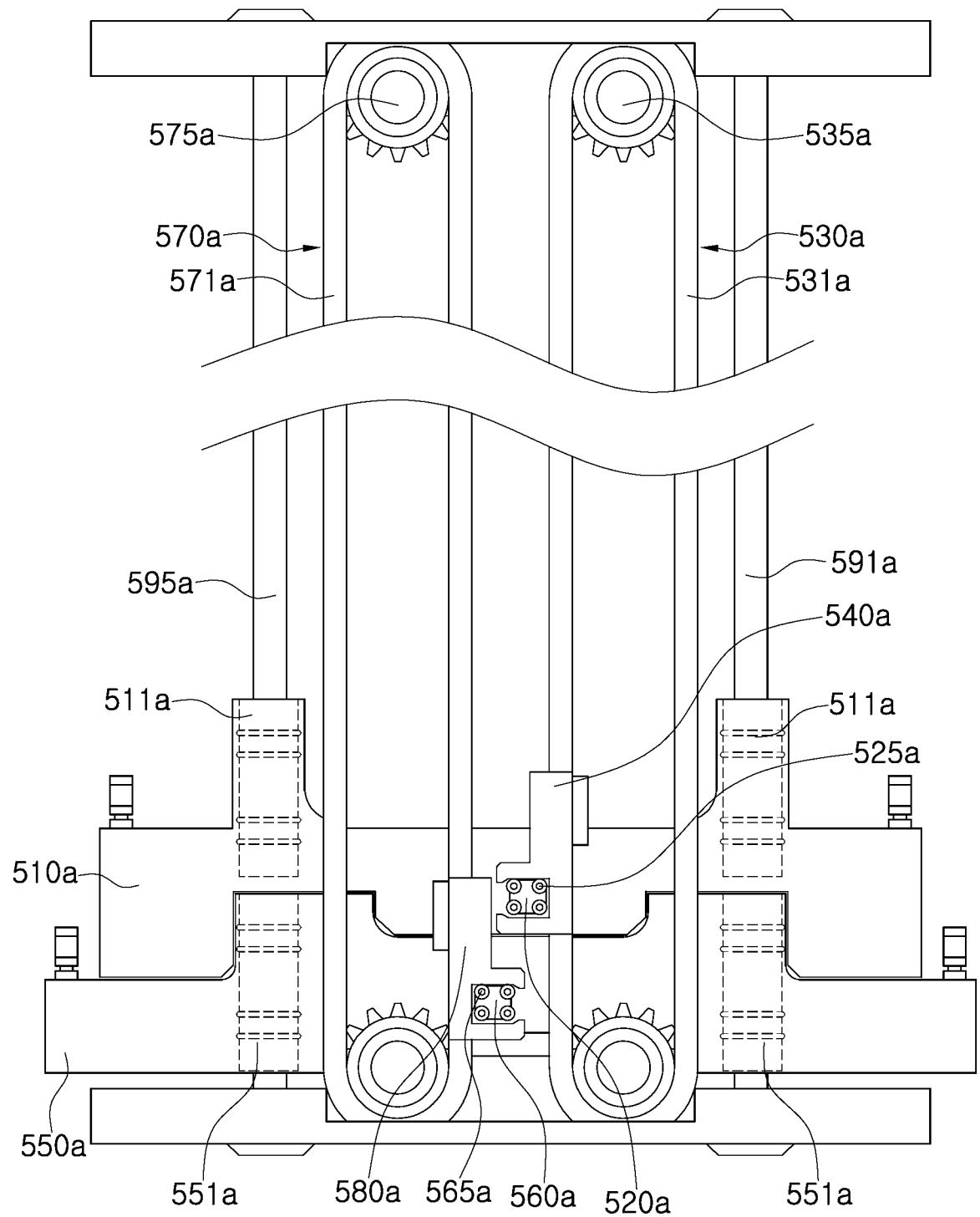
FIG. 7 is a view showing an embodiment of the elevator unit for transferring a tray according to the present disclosure.

FIG. 7 is a view showing an embodiment of an elevator unit for transferring a tray according to the present disclosure.

FIG. 7 shows an elevator unit, which is a modified embodiment of FIG. 5 as described above, and a description of overlapping parts with the embodiment of FIG. 5 will be omitted.

Each of the corrective fastening members 540a and 580a has an opening part and an insertion space provided on one side thereof, whereby the fixed fastening members 520a and 560a may be inserted into and connected to the corrective fastening members 540a and 580a, respectively.

Each of the fixed fastening members 520a and 560a may include a support portion mounted and fixed to a corresponding tray guide block and wheels 525a or 565a fastened to the support portion. Here, each of the support portions may have a rectangular or polygonal cross section, and the wheels 525a or 565a may be fastened to corner portions of the corresponding one of the support portions. Although each of the fixed fastening members 520a and 560a is illustrated as having four wheels 525a or 565a in FIG. 7, a shape of each of the supports and the number and arrangement positions of the wheels of each of the supports may be appropriately modified as needed.

As described above, the fixed fastening members 520a and 560a include the wheels 525a and 565a, respectively, so rotation of each of the corrective fastening members 540a and 580a may be more easily aided.

Figure 8:
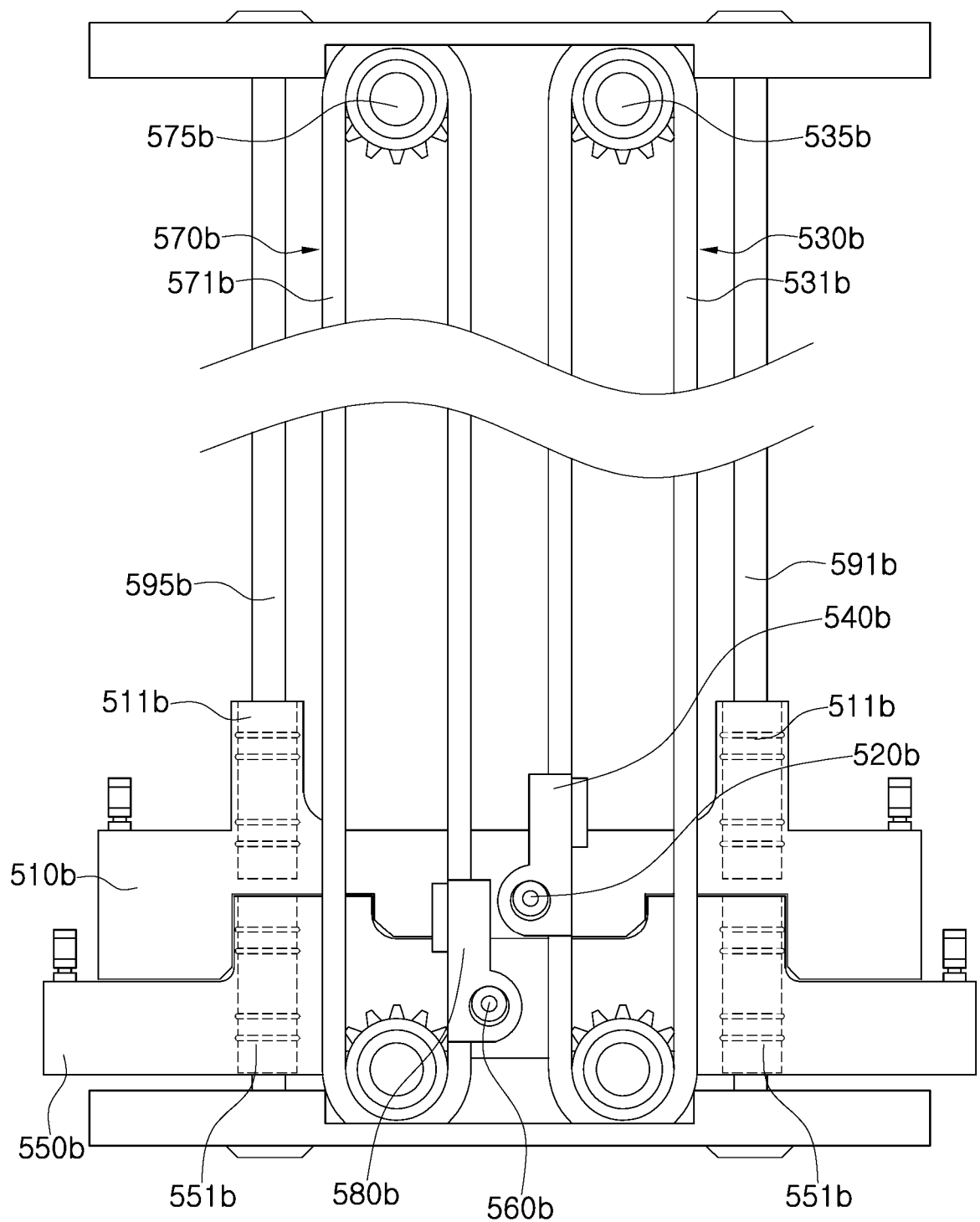
FIG. 8 is a view showing an embodiment of the elevator unit for transferring a tray according to the present disclosure.

FIG. 8 is a view showing an embodiment of an elevator unit for transferring a tray according to the present disclosure.

FIG. 8 shows an elevator unit, which is a modified embodiment of FIGS. 5 and 7 as described above, and the description of the overlapping parts as described with reference to FIGS. 5 and 7 will be omitted.

Each of the corrective fastening members 540b and 580b has one end extending to one side and provided with a through hole, which a corresponding one of the fixed fastening members 520b and 560b is inserted into and connected to, whereby each of the fixed fastening members 520b and 560b may be inserted into and connected to the corresponding through hole.

The fixed fastening members 520b and 560b may each have a circular cross section, and an insertion space may be provided in the through hole of each of the corrective fastening members 540b and 580b to correspond to the sectional shape of the fixed fastening member 520b or 560b.

In this case, in order to easily aid rotation of the corrective fastening members 540b and 580b, each of the fixed fastening members 520b and 560b may include a wheel.

Figure 9A:
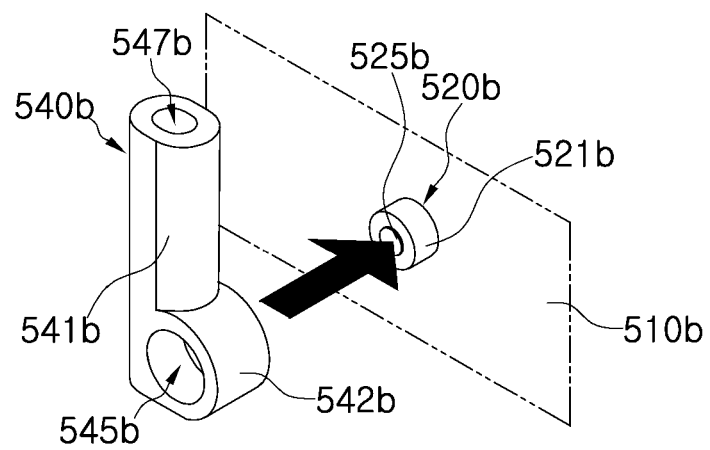
FIGS. 9A and 9B are views each showing a connection relationship between the fixed fastening member and the corrective fastening member in the embodiment of FIG. 8.
Figure 9B:
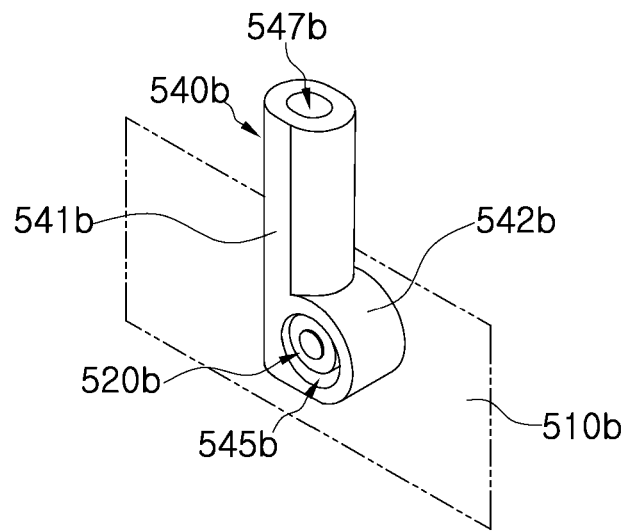

A connection structure of the fixed fastening members 520b and 560b and the corrective fastening members 540b and 580b will be described with reference to FIG. 9. FIG. 9 shows a connection structure of the corrective fastening member 540b mounted on the second wrapping connector driving member 530b and the fixed fastening member 520b mounted on the second tray guide block 510b.

The fixed fastening member 520b may be mounted to protrude at a portion adjacent to a side of the wrapping connector driving member 530b on the side of the tray guide block 510b so as not to interfere with the movement of the wrapping connector driving member 530b.

The fixed fastening member 520b may include a rotatable wheel 521b and a support portion 525b fastening the wheel 521b on the tray guide block 510b and configured to support the wheel 521b to be able to rotate.

In addition, the corrective fastening member 540b may include a fixed fastening part 541b in which the wrapping connector driving member 530b is fixedly mounted and a rotative fastening part 542b extending laterally from the fixed fastening part 541b and connected to the fixed fastening member 520b. Here, the rotative fastening part 542b of the corrective fastening member 540b may be provided with a through hole to provide an insertion space 545b which the fixed fastening member 520b is inserted into and connected into. The insertion space 545b may have a size in which the fixed fastening member 520b is inserted in a fitting form or may be provided as a space having a sectional area larger than that of the fixed fastening member 520b.

As described above, the fixed fastening members 520b and 560b are provided with the wheels 521b and 561b, respectively, so rotation of the corrective fastening members 540b and 580b may be more easily aided.

Hereinafter, a structure of a related art and the structure of the present disclosure will be described with respect to the principle of operation in which the direction of the force is corrected through the fixed fastening members and the corrective fastening members in the present disclosure to resolve the eccentricity and the eccentric load.

Figure 10:
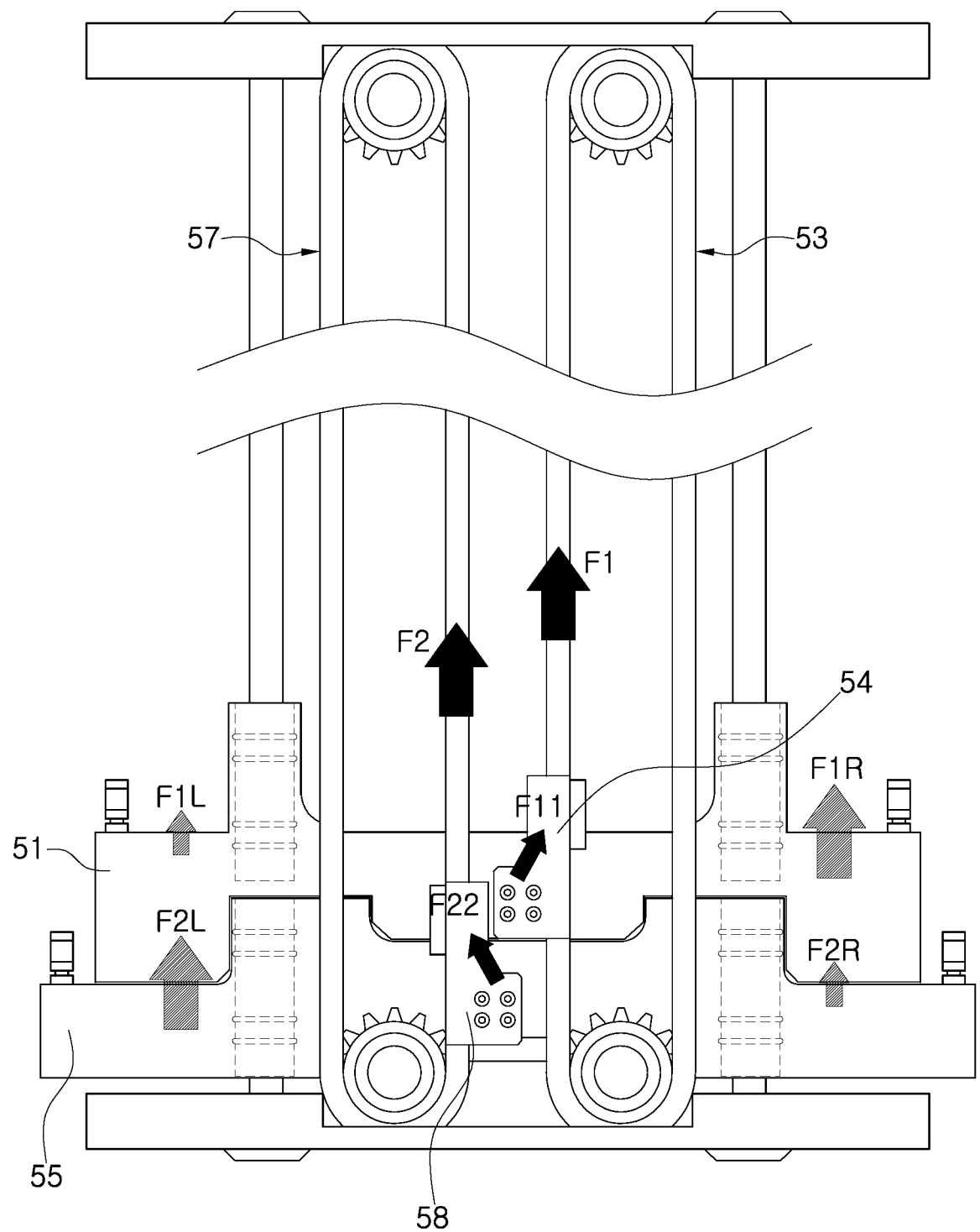
FIG. 10 is a view showing an operation relationship of an elevator unit for transferring a tray according to the related art.

FIG. 10 shows an operation relationship of an elevator unit for transferring a tray according to the related art.

In the case of the related art, in an elevator unit 50 for transferring a tray, fastening members 54 and 58 that transfer force according to the movement of wrapping connector driving members 53 and 57 are fixed and mounted on sides of the tray guide blocks 51 and 55, respectively. That is, the fastening members 54 and 58 are fixedly mounted to the wrapping connector driving members 53 and 57, respectively, and at the same time, fixedly coupled to the side surfaces of the tray guide blocks 51 and 55, respectively, through screw coupling or the like.

According to the structure of the related art, when the wrapping connector driving members 53 and 57 elevate the tray guide blocks 51 and 55, respectively, forces F1 and F2 according to the movement of the wrapping connector driving members 53 and 57, respectively, act as forces F11 and F22 in different directions on the tray guide blocks 51 and 55, respectively.

Each of the forces F11 and F22 elevating the tray guide blocks 51 and 55, respectively, acts in an oblique direction different from an upward direction, so the eccentricity and the eccentric load are generated on each of the tray guide blocks 51 and 55. Due to the eccentricity and the eccentric load, each of the forces F1R, F1L, F2L, and F2R different from each other is transferred to each corresponding one of the opposite sides of each of the tray guide blocks 51 and 55, whereby each of the tray guide blocks 51 and 55 is elevated in a twisted state. An occurrence of the eccentricity and the eccentric load on each of the tray guide blocks 51 and 55 is an obstacle to the stable ascending and descending of each of the tray guide blocks 51 and 55, which wears out the ball bushes and the like mounted on each of the tray guide blocks 51 and 55 and continuously accumulates stress on the ball bushes, thereby eventually causing damage to the ball bushes.

The present disclosure is to propose a structure configured to resolve such eccentricity and eccentric load, and it will be described with reference to the operation relationship of the embodiment of FIG. 7 among various embodiments of the elevator unit for transferring a tray according to the present disclosure described above.

Figure 11:
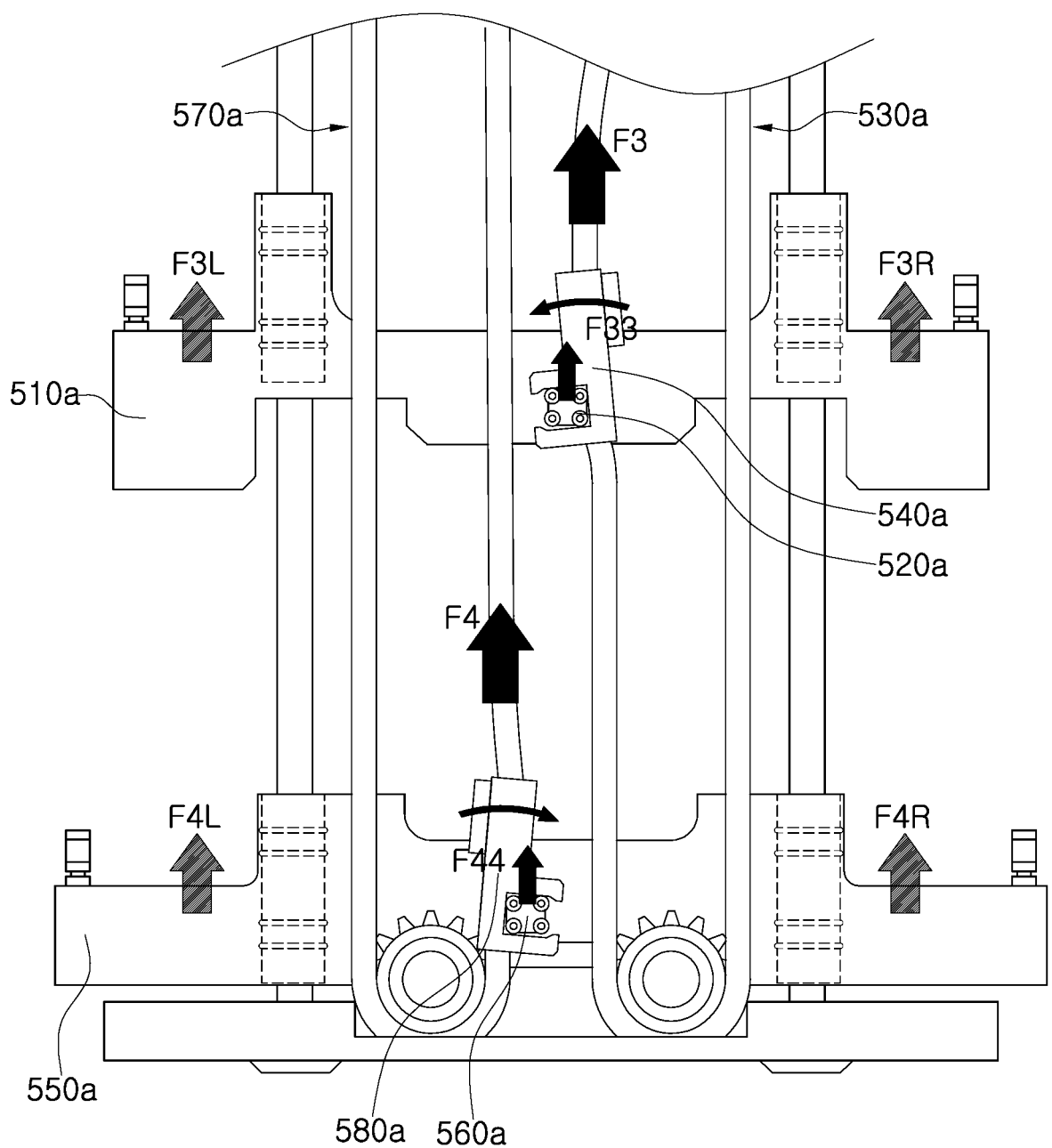
FIGS. 11 and 12 are views each showing the operation relationship for the embodiment of FIG. 7 of the elevator unit for transferring a tray according to the present disclosure.

FIG. 11 is a view showing an elevating operation relationship for the embodiment of FIG. 7 of the elevator unit for the transferring a tray according to the present disclosure.

When the wrapping connector driving members 530a and 570a move to elevate the tray guide blocks 510a and 550a, respectively, while being elevated, each of the corrective fastening members 540a and 580a that are respectively mounted on the wrapping connector driving members 530a and 570a comes into contact with a corresponding one of the fixed fastening members 520a and 560a that are respectively mounted on the tray guide blocks 510a and 550a.

As the ascending forces F3 and F4 through the corrective fastening members 540a and 580a are gradually transferred to the fixed fastening members 520a and 560a, respectively, the corrective fastening members 540a and 580a are gradually rotated with respect to the fixed fastening members 520a and 560a as references, respectively.

The ascending forces F3 and F4 according to the rotation of the corrective fastening members 540a and 580a, respectively, are each moved to approach the center of each of the tray guide blocks 510a and 550a. In addition, forces F33 and F44 transferred to the fixed fastening members 520a and 560a, respectively, according to the rotation of the corrective fastening members 540a and 580a are corrected in the same direction as the ascending forces F3 and F4 transferred through the wrapping connector driving members 530a and 570a, respectively. By correcting the force direction according to the rotation of the corrective fastening members 540a and 580a, the eccentricity and the eccentric loads are resolved, so that the same forces F3L, F3R, F4L, and F4R may be transferred to each of the opposite sides of each of the tray guide block 510a and 550a.

Figure 12:
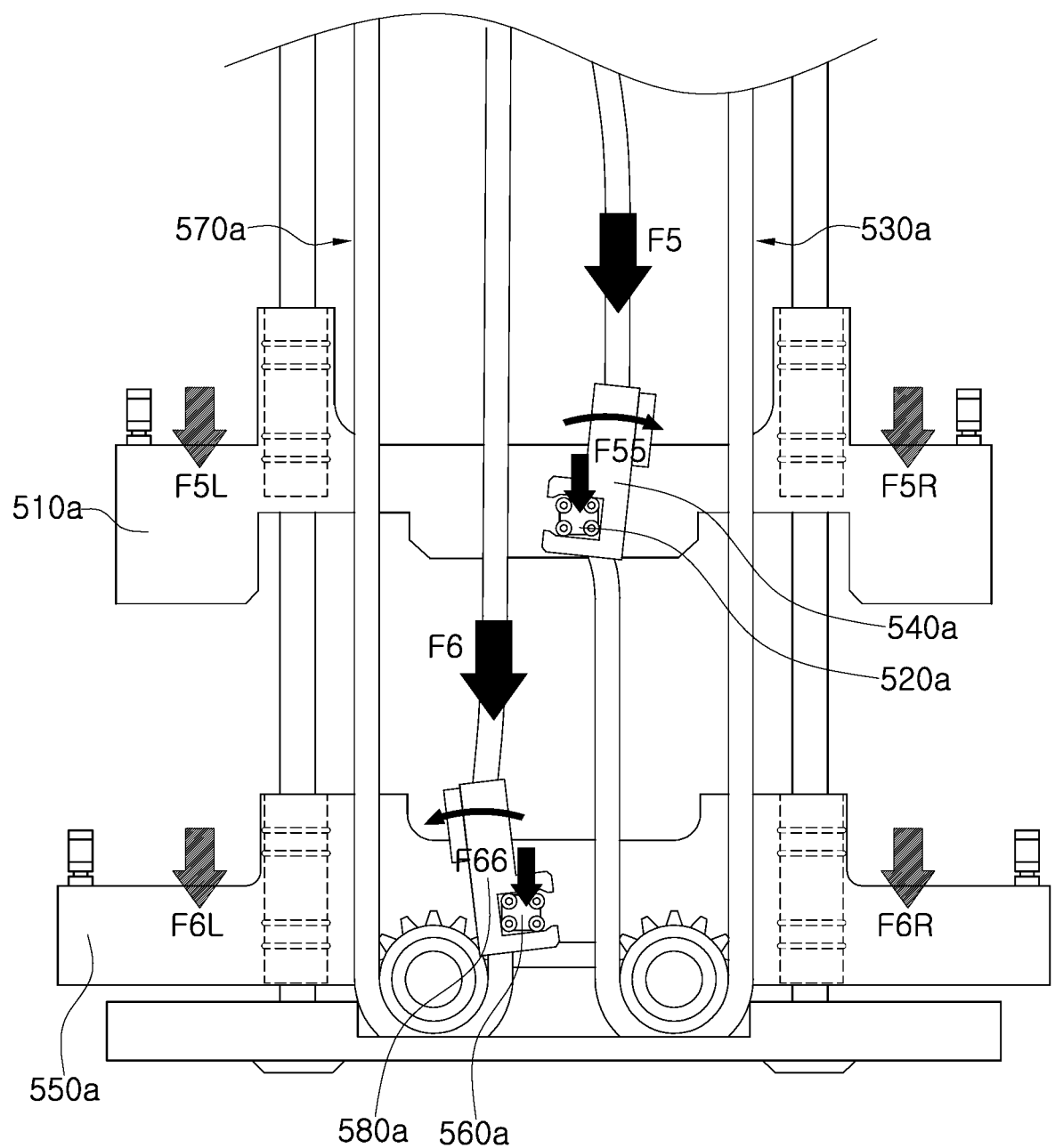

FIG. 12 is a view showing a lowering operation relationship for the embodiment of FIG. 7 of the elevator unit for transferring a tray according to the present disclosure.

When the wrapping connector driving members 530a and 570a move to lower the tray guide blocks 510a and 550a, respectively, while being lowered, each of the corrective fastening members 540a and 580a that are respectively mounted on the wrapping connector driving members 530a and 570a comes into contact with a corresponding one of the fixed fastening members 520a and 560a that are respectively mounted on the tray guide blocks 510a and 550a.

As the descending forces F5 and F6 through the corrective fastening members 540a and 580a are gradually transferred to the fixed fastening members 520a and 560a, respectively, the corrective fastening members 540a and 580a are gradually rotated with respect to the fixed fastening members 520a and 560a as references, respectively.

The descending forces F5 and F6 according to the rotation of the corrective fastening members 540a and 580a, respectively, are each moved to approach the center of each of the tray guide blocks 510a and 550a. In addition, the forces F55 and F66 transferred to the fixed fastening members 520a and 560a, respectively, according to the rotation of the corrective fastening members 540a and 580a are corrected in the same direction as the descending forces F5 and F6 transferred through the wrapping connector driving members 530a and 570a. By correcting the force direction according to the rotation of the corrective fastening members 540a and 580a, the eccentricity and the eccentric loads are resolved, so that the same forces F3L, F3R, F4L, and F4R may be transferred to each of the opposite sides of each of the tray guide block 510a and 550a.

The elevator unit configured to resolve the eccentricity and the eccentric load according to the present disclosure may be disposed in the test handler.

As an example, by disposing the elevator unit 500 in the soak chamber 200 configured to control the semiconductor devices seated on the tray to the test temperature, the tray may be stably elevated and lowered.

As another example, by disposing the elevator unit 500 in the desoak chamber 400 configured to control the semiconductor devices seated on the tray to the room temperature, the tray may be stably elevated and lowered.

The elevator unit 500 of the present disclosure may be selectively disposed at a required position in the test handler 100.

Through the elevator unit according to the present disclosure, as described above, it is possible to resolve the eccentricity and the eccentric loads generated during elevating or lowering of the tray guide blocks.

In particular, by correcting a direction of force applied to a tray guide block during elevating or lowering of the tray guide block through a corrective fastening member, it is possible to solve the problem that transferring of the/a tray is not smoothly performed because of jamming of the driving part due to the eccentricity and the eccentric load, and it is possible to solve the problem that wear and breakage of the ball bushes that support the movement of the tray occur due to the stress caused by the continuous accumulation of eccentricity and eccentric loads.

The above description is merely illustrative of the technical spirit of the present disclosure, and various modifications and variations will be possible without departing from the essential characteristics of the present disclosure by those skilled in the art to which the present disclosure pertains. Therefore, the embodiments described in the present disclosure are not intended to limit but to explain the technical spirit of the present disclosure, and the technical spirit of the present disclosure is not limited by such embodiments. The protection scope of the present disclosure should be construed by the following claims, and all technical ideas within the scope equivalent thereto should be construed as being included in the scope of the present disclosure.

What is claimed is:

1. An elevator unit for transferring a tray, the elevator unit comprising:
    a tray guide block on which a tray is seated;
    a wrapping connector driving member configured to elevate and lower the tray guide block;
    a fixed fastener connected to the tray guide block; and
    a corrective fastener connected to the wrapping connector driving member and configured to rotatably coupled to the fixed fastener.

2. The elevator unit of claim 1,
    wherein the corrective fastener rotates around the fixed fastener as a center so that a direction of force applied to the tray guide block is corrected according to a moving direction of the wrapping connector driving member.

3. The elevator unit of claim 1,
    wherein the fixed fastener is connected at a portion adjacent to a side surface of the wrapping connector driving member on the tray guide block so as not to interfere with a movement of the wrapping connector driving member, and
    wherein the corrective fastener comprises:
    a fixed fastening part fixedly fastened to the wrapping connector driving member; and
    a rotative fastening part extending laterally from the fixed fastening part and configured to be connected to the fixed fastener.

4. The elevator unit of claim 3,
    wherein the rotative fastening part is provided with an opening part, which is provided on one side thereof and provided with the fixed fastener inserted into and connected to,
    wherein the opening part is provided with an insertion space having a sectional area larger than a sectional area of the fixed fastener.

5. The elevator unit of claim 4,
    wherein the rotative fastening part is provided with a locking protrusion protruding toward the opening part to prevent the fixed fastener from being separated.

6. The elevator unit of claim 4,
wherein the fixed fastener has a polygonal cross section and has curved portions provided at opposite ends thereof so as to aid rotation of the corrective fastener.

7. The elevator unit of claim 4,
wherein the fixed fastener comprises:
a support portion having a polygonal cross section and mounted on and fixed to the tray guide block; and
one or more wheels mounted on a shell of the support portion, thereby aiding rotation of the corrective fastener.

8. The elevator unit of claim 3,
wherein the fixed fastener is provided with a circular cross section, and
wherein the rotative fastening part is provided with an insertion space, which has a sectional area larger than a sectional area of the fixed fastener and which the fixed fastener inserted into and fitted to.

9. The elevator unit of claim 8,
wherein the fixed fastener comprises:
a rotatable round wheel; and
a support portion fastening the rotatable round wheel to the tray guide block and supporting the rotatable round wheel.

10. The elevator unit of claim 1, further comprising:
a pulley connected to each of opposite ends of the wrapping connector driving member; and
an elevating and lowering driving unit configured to elevate and lower the tray guide block by rotating the pulleys to move the wrapping connector driving member.

11. The elevator unit of claim 1,
wherein the wrapping connector driving member comprises a chain or a belt having opposite ends connected to each other.

12. The elevator unit of claim 1, further comprising:
a guide member configured to guide elevating and lowering of a movement of the tray guide block while supporting each of opposite portions at an inside of the tray guide block, and
a ball bush mounted in each of the opposite portions of the tray guide block, to support the movement of the tray guide block through the guide member corresponding thereto.

13. The elevator unit of claim 1,
wherein the tray guide block is provided in a plurality of multi-stages in a height direction, and
wherein the wrapping connector driving member is provided to correspond to a number of the tray guide block and to be spaced apart in a horizontal direction.

14. The elevator unit of claim 13,
wherein the tray guide block comprises:
a first tray guide block; and
a second tray guide block positioned above the first tray guide block in the height direction, and
wherein the wrapping connector driving member comprises:
a first wrapping connector driving member connected to a side surface of the first tray guide block to elevate and lower the first tray guide block; and
a second wrapping connector driving member spaced apart from the first wrapping connector driving member in the horizontal direction and connected to a side surface of the second tray guide block to elevate and lower the second tray guide block.

15. The elevator unit of claim 14,
wherein the first wrapping connector driving member is positioned spaced apart in one direction from a center of the side surface of the first tray guide block, and
wherein the second wrapping connector driving member is positioned spaced apart in an opposite direction from a center of the side surface of the second tray guide block.

16. The elevator unit of claim 1,
wherein the fixed fastener is provided in a pair,
wherein the pair of fixed fasteners are connected to opposite side surfaces of the tray guide block, respectively,
wherein the wrapping connector driving member is provided in a pair,
wherein the corrective fastener is provided in a pair,
wherein the pair of wrapping connector driving members are provided to the pair of fixed fasteners, respectively, and
wherein the pair of corrective fasteners are connected to the pair of wrapping connector driving members, respectively.

17. A test handler, comprising:
a soak chamber configured to control semiconductor devices seated on a tray to a test temperature;
a test chamber configured to perform electrical tests on the semiconductor devices seated on the tray;
a desoak chamber configured to control the semiconductor devices seated on the tray to a room temperature; and
an elevator unit for transferring a tray of claim 1.

18. The test handler of claim 17,
wherein the elevator unit is disposed to elevate and lower the tray in the soak chamber.

19. The test handler of claim 17,
wherein the elevator unit is disposed to elevate and lower the tray in the desoak chamber.

20. An elevator unit for transferring a tray, the elevator unit comprising:
a first tray guide block on which the tray is seated;
a second tray guide block on which the tray is seated and which is positioned above the first tray guide block in a height direction;
a first wrapping connector driving member connected to a side surface of the first tray guide block to elevate and lower the first tray guide block;
a second wrapping connector driving member spaced apart from the first wrapping connector driving member in a horizontal direction and connected to a side surface of the second tray guide block to elevate and lower the second tray guide block;
a fixed fastener mounted to each of the first tray guide block and the second tray guide block; and
a compensation fastener mounted on each of the first wrapping connector driving member and the second wrapping connector driving member, connected to the fixed fastener corresponding thereto, and rotating around the fixed fastener corresponding thereto as a center so that a direction of force applied to each of the first tray guide block and the second tray guide block according to a movement direction of each of the first wrapping connector driving member and the second wrapping connector driving member is corrected.

* * * * *